United States Patent
Huston et al.

(10) Patent No.: US 11,955,362 B2
(45) Date of Patent: Apr. 9, 2024

(54) SUBSTRATE SUPPORT FOR REDUCED DAMAGE SUBSTRATE BACKSIDE

(71) Applicant: APPLIED MATERIALS, INC., Santa Clara, CA (US)

(72) Inventors: Joel M Huston, San Jose, CA (US); Cheng-Hsiung Tsai, Cupertino, CA (US); Gwo-Chuan Tzu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 978 days.

(21) Appl. No.: 15/703,961

(22) Filed: Sep. 13, 2017

(65) Prior Publication Data
US 2019/0080951 A1 Mar. 14, 2019

(51) Int. Cl.
*H01L 21/683* (2006.01)
*H01L 21/67* (2006.01)
*H01L 21/677* (2006.01)
*H01L 21/687* (2006.01)
*H01L 21/78* (2006.01)

(52) U.S. Cl.
CPC .... *H01L 21/6835* (2013.01); *H01L 21/67098* (2013.01); *H01L 21/6719* (2013.01); *H01L 21/67751* (2013.01); *H01L 21/6875* (2013.01); *H01L 21/68757* (2013.01); *H01L 21/78* (2013.01); *H01L 21/67109* (2013.01); *H01L 21/6831* (2013.01)

(58) Field of Classification Search
CPC ............ H01L 21/6835; H01L 21/6875; H01L 21/68757; H01J 2237/332–3348
USPC ................................... 118/715–733
See application file for complete search history.

(56) References Cited

U.S. PATENT DOCUMENTS

| | | | |
|---|---|---|---|
| 5,720,818 A | * | 2/1998 | Donde ............... C23C 16/4586 118/500 |
| 5,761,023 A | | 6/1998 | Lue et al. |
| 5,910,338 A | | 6/1999 | Donde |
| 6,077,357 A | | 6/2000 | Rossman et al. |
| 6,104,002 A | | 8/2000 | Hirose et al. |
| 6,182,602 B1 | | 2/2001 | Redeker et al. |

(Continued)

FOREIGN PATENT DOCUMENTS

| | | |
|---|---|---|
| CN | 103779166 A | 5/2014 |
| JP | H0547652 A | 2/1993 |

(Continued)

OTHER PUBLICATIONS

International Search Report and Written Opinion dated Jan. 2, 2019 for PCT Application No. PCT/US2018/050446.

*Primary Examiner* — Charlee J. C. Bennett
(74) *Attorney, Agent, or Firm* — Moser Taboada

(57) ABSTRACT

Embodiments of substrate supports and process chambers equipped with the same are provided. In some embodiments, a substrate support includes: a support body having a first surface; one or more receptacles extending through the first surface and into the support body; and one or more protrusions respectively disposed within corresponding ones of the one or more receptacles and projecting from the first surface, wherein the one or more protrusions at least partially define a substantially planar support surface above the first surface. Methods of eliminating backside wafer damage are also disclosed.

19 Claims, 5 Drawing Sheets

(56) References Cited

U.S. PATENT DOCUMENTS

| | | | |
|---|---|---|---|
| 6,189,483 B1 | 2/2001 | Ishikawa et al. | |
| 6,320,736 B1 | 11/2001 | Shamouilian et al. | |
| 6,461,980 B1 | 10/2002 | Cheung et al. | |
| 6,682,603 B2 | 1/2004 | Gondhalekar et al. | |
| 6,890,403 B2 | 5/2005 | Cheung et al. | |
| 6,944,006 B2 | 9/2005 | Zheng et al. | |
| 7,480,129 B2 | 1/2009 | Brown et al. | |
| 7,589,950 B2 | 9/2009 | Parkhe et al. | |
| 7,907,384 B2 | 3/2011 | Brown et al. | |
| 8,198,567 B2 | 6/2012 | Lerner et al. | |
| 8,390,980 B2 | 3/2013 | Sansoni et al. | |
| 8,698,048 B2 | 4/2014 | Lerner et al. | |
| 9,558,981 B2 | 1/2017 | Boyd, Jr. et al. | |
| 9,613,846 B2 | 4/2017 | Raj et al. | |
| 2003/0015517 A1* | 1/2003 | Fure | H01L 21/67103 219/444.1 |
| 2004/0163601 A1 | 8/2004 | Kadatani et al. | |
| 2004/0218340 A1 | 11/2004 | Kitabayashi et al. | |
| 2006/0130767 A1* | 6/2006 | Herchen | H01L 21/6715 118/728 |
| 2006/0156981 A1 | 7/2006 | Fondurulia et al. | |
| 2006/0289432 A1* | 12/2006 | Morita | F27B 5/04 219/390 |
| 2007/0040265 A1 | 2/2007 | Umotoy et al. | |
| 2007/0128570 A1* | 6/2007 | Goto | H01L 21/6875 432/253 |
| 2007/0128889 A1* | 6/2007 | Goto | H01L 21/6875 438/795 |
| 2008/0157452 A1 | 7/2008 | Camm et al. | |
| 2009/0173446 A1* | 7/2009 | Yang | C23C 16/4585 156/345.51 |
| 2010/0195080 A1* | 8/2010 | Compen | G03F 7/707 355/72 |
| 2011/0183279 A1 | 7/2011 | Okubo et al. | |
| 2011/0183297 A1 | 7/2011 | Thiel et al. | |
| 2012/0027918 A1 | 2/2012 | Tiner et al. | |
| 2012/0205878 A1* | 8/2012 | Lerner | H01L 21/67109 279/3 |
| 2012/0286568 A1 | 11/2012 | Duan et al. | |
| 2014/0151332 A1 | 6/2014 | Fukasawa | |
| 2014/0252710 A1* | 9/2014 | Cuvalci | H01L 21/6875 269/21 |
| 2016/0155965 A1* | 6/2016 | Kusuura | H01L 51/0024 361/749 |
| 2017/0125280 A1 | 5/2017 | Ghosh et al. | |
| 2019/0067069 A1 | 2/2019 | Glasko et al. | |
| 2019/0096736 A1* | 3/2019 | Zhou | H01L 21/68785 |

FOREIGN PATENT DOCUMENTS

| | | |
|---|---|---|
| JP | H0758041 A | 3/1995 |
| JP | 1996-276548 A | 10/1996 |
| JP | H08-279548 | 10/1996 |
| JP | H10242255 A | 9/1998 |
| JP | 2002261156 A | 9/2002 |
| JP | 2005033221 A | 2/2005 |
| JP | 2005101310 A | 4/2005 |
| JP | 2006093203 A | 4/2006 |
| JP | 2006313816 A | 11/2006 |
| JP | 2015008240 A | 1/2015 |
| JP | 2017-005209 A | 1/2017 |
| KR | 10-2010-010340 A | 9/2010 |
| KR | 20100103401 A * | 9/2010 |
| KR | 101282873 B1 * | 7/2013 |
| TW | 201742183 A | 12/2017 |

* cited by examiner

SUBSTRATE SUPPORT FOR REDUCED DAMAGE SUBSTRATE BACKSIDE

FIELD

Embodiments of the present disclosure generally relate to semiconductor manufacturing equipment.

BACKGROUND

In the manufacture of integrated circuits (ICs), substrates may be heated to high temperatures so various chemical and/or physical reactions can take place. Thermal processes are usually used to heat the substrates. A typical thermal process, such as annealing, requires providing a relatively large amount of thermal energy to the substrate in a short amount of time, and thereafter rapidly cooling the wafer to terminate the thermal process. Heated chucks are used to secure substrates in process chambers during these thermal processes.

A certain amount of controlled contact between the chuck and substrate is required for consistent thermal uniformity, and the inventors have observed that contact areas between the heated chuck support surface and substrate are problematic and can cause damage to the side of the substrate contacting the support surface, for example when a cold substrate expands due to heating. While attempts have been made to minimize contact areas, the inventors have observed that by minimizing contact surface area, an increased force is exerted on the substrate concentrating and increasing damage to the lower surface of the substrate. The inventors have observed that this situation is even more problematic when the substrate is a softer material than the contact area, as additional damage to the backside of the substrate may occur in the form of dents or scratches.

The inventors have further observed that continued use of a chuck may also warp the substrate support and/or wear out the contact areas between the substrate support and the substrate. The inventors have observed that warpage and wear are detrimental to the integrity and planarity of the substrate.

Therefore, the inventors have provided improved embodiments of substrate supports.

SUMMARY

Embodiments of substrate supports and process chambers equipped with the same are provided. In some embodiments, a substrate support includes: a support body having a first surface; one or more receptacles extending through the first surface and into the support body; and one or more protrusions respectively disposed within corresponding ones of the one or more receptacles and projecting from the first surface, wherein the one or more protrusions at least partially define a substantially planar support surface above the first surface. Methods of eliminating back-side wafer damage are also disclosed.

In some embodiments, a substrate support includes: a support body having a first surface; one or more receptacles extending through the first surface and into the support body; one or more protrusions respectively disposed within corresponding ones of the one or more receptacles and projecting from the first surface, wherein the one or more protrusions at least partially define a substantially planar support surface above the first surface; and at least one channel disposed though the support body to the first surface to supply a gas or vacuum to a space defined between the first surface and a backside of a substrate when disposed on the substrate support.

In some embodiments, a process chamber includes: a chamber body having sidewalls and a bottom; and a substrate support disposed within the chamber body. The substrate support is as described in any of the embodiments disclosed herein.

Other and further embodiments of the present invention are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
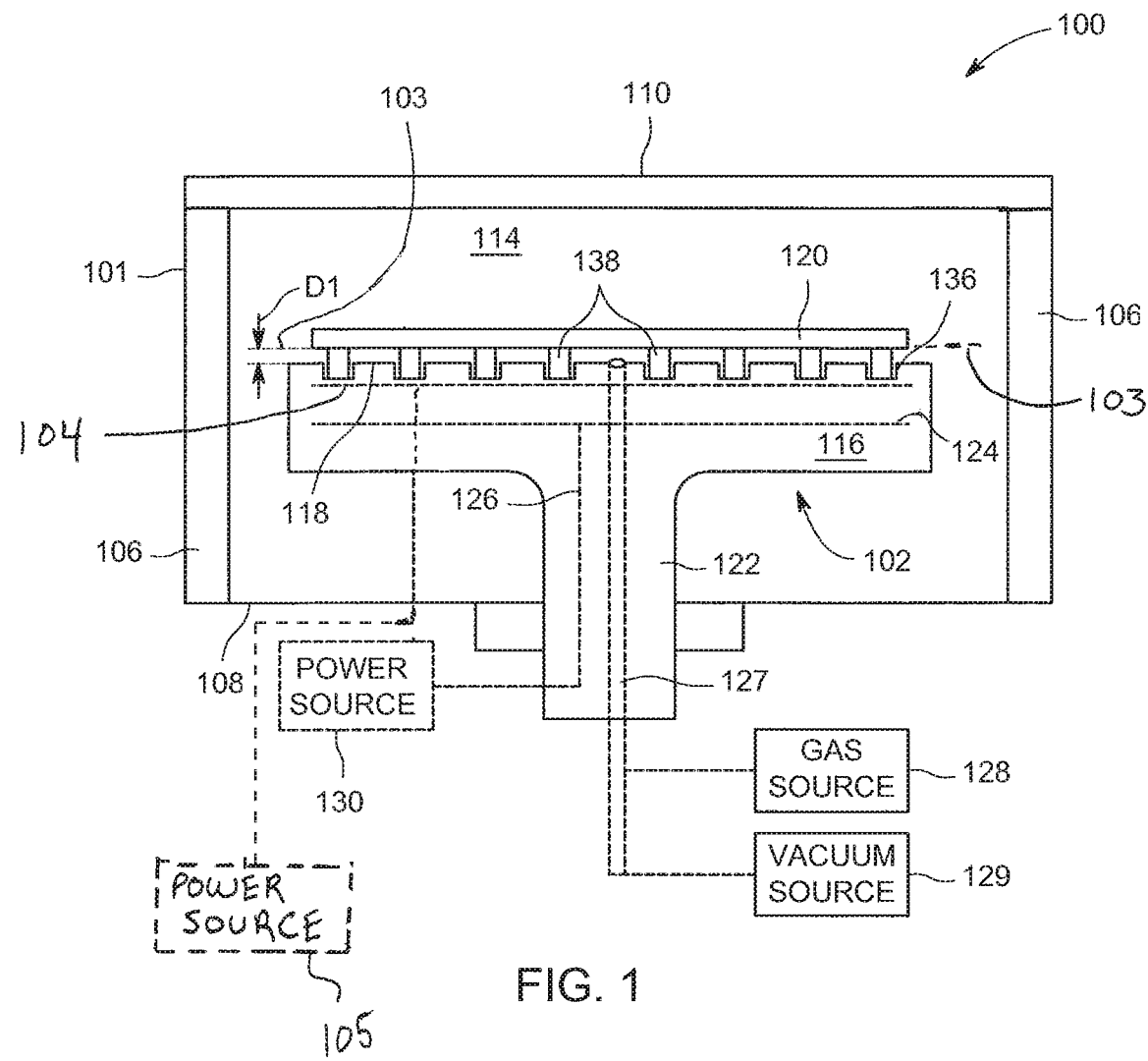
FIG. 1 schematically illustrates a cross-sectional view of a process chamber with a substrate support in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide improved substrate supports and processing apparatus that reduce or eliminate substrate damage along the side of the substrate that contacts the substrate support (e.g., the backside) as compared to conventional substrate supporting apparatus. Embodiments of the present disclosure may advantageously avoid or reduce backside substrate damage during the manufacturing process, such as while chucking a substrate in a semiconductor process chamber, which can further limit or prevent substrate warpage and non-uniformity. Embodiments of the present disclosure may be used in substrate supports that contact a substrate in a process that utilizes chucking, for example, silicon wafer processing using vacuum or electrostatic chucks.

FIG. 1 schematically illustrates a cross-sectional view of a process chamber 100 with a substrate support 102 in accordance with some embodiments of the present disclosure. Process chamber 100 may be any substrate processing chamber that supports a substrate during processing. In some embodiments, process chamber 100 may be a semiconductor substrate processing chamber, for example, one that processes semiconductor wafers. In some embodiments, the process chamber 100 may be configured to heat the supported substrate to high temperatures. In some non-limiting examples, the process chamber 100 may be an annealing chamber, which may be part of a semiconductor processing system such as those available from Applied Materials, Inc. of Santa Clara, CA, or the process chamber 100 may be a processing chamber such as those described in U.S. Pat. No. 8,698,048 to Lerner, et al. entitled *High Temperature Vacuum Chuck Assembly*. Other processing chambers, including those available from other manufacturers, may also be adapted to benefit from this disclosure.

The process chamber 100 generally includes a chamber body 101. The chamber body 101 has sidewalls 106, a bottom 108, and a lid 110 that define a process volume 114. The process volume 114 is typically accessed through a valve (not shown) in the sidewall 106 that facilitates movement of a substrate 120 into and out of the process volume 114 of the chamber body 101. The sidewalls 106 and bottom 108 of the chamber body 101 are generally fabricated from a unitary block of aluminum or other material compatible with process chemistries, although other configurations including multiple piece construction may be used.

The substrate support 102 is centrally disposed within the chamber body 101 and supports the substrate 120 during processing. The substrate support 102 generally includes a support body 116 having a first surface 118. In embodiments, support body 116 is supported by a shaft 122 that extends through the bottom 108. The support body 116 is generally circular in shape and may be fabricated from materials such as quartz, ceramics such as alumina, or metallic composition such as stainless steel, duplex stainless steel, titanium, alloy steels, tool steel compositions, and combinations thereof. In embodiments, support body 116 is at least partially coated with a material to reduce the coefficient of friction thereof as further described below.

In embodiments, the support body 116 includes one or more receptacles 136 and one or more protrusions 138 disposed within the receptacles 136 and detachable therefrom or removably coupled thereto such as further described below. In some embodiments, one or more receptacles 136 extend through the first surface 118 and into the support body 116. One or more protrusions 138 are respectively disposed within corresponding ones of the one or more receptacles 136 and project from the first surface 118. The one or more protrusions 138 at least partially define a substantially planar support surface 103 above the first surface 118. Referring to FIG. 1, D1 represents the height of the planar support surface above first surface 118 and shows a gap between the planar support surface 103 and the first surface 118. In embodiments, the planar support surface is about 0.05 millimeters to 5 millimeters, or 0.1 millimeters to 1 millimeter, or about 0.15 millimeters above first surface 118. In embodiments, the planar support is above the entire first surface 118 of support body 116.

In some embodiments, the support body 116 includes at least one heating element 124 (shown in phantom). In some embodiments, the heating element 124 is encapsulated within the support body 116. The heating element 124, such as an electrode or resistive heating element, is coupled to a power source 130 via electrical connector assembly 126 and controllably heats the support body 116 and substrate 120 positioned thereon during processing to a predetermined temperature. In some embodiments, the heating element 124 is configured to heat the substrate 120 to a temperature between about 20° C. and 750° C. during processing. In some embodiments, at least one channel 127 (shown in phantom) is disposed though the support body 116 to supply a gas or vacuum to a space defined between the first surface 118 and the backside of the substrate 120, when disposed on the substrate support. The at least one channel 127 may be coupled to a gas source 128 to provide a gas or to a vacuum source 129 to provide a suction force (e.g., vacuum pressure) on the substrate 120 positioned on the support body 116 during processing. Support body 116 may include a DC electrode 104 (shown in phantom) and additional power source 105 (shown in phantom) such as those suitable for use in an electrostatic chuck. Support body 116 may include additional elements commonly found in substrate supports for microelectronic device fabrication, such as non-limiting examples of cooling elements, RF electrode and/or backside gas provisioning, or the like. These additional elements are not shown for simplicity of description.

During processing, the substrate 120 may be placed within the chamber body 101 (e.g., atop the substrate support). Substrate 120 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 120 may be a semiconductor wafer. The substrate 120 is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

Figure 2A:
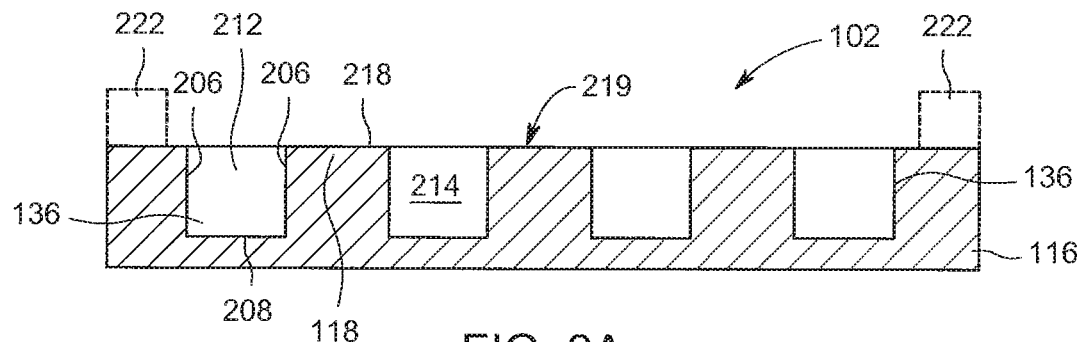
FIGS. 2A-2C schematically illustrates a cross-sectional view of a substrate support in accordance with some embodiments of the present disclosure.

Referring now to FIG. 2A, a schematic illustration of a cross-sectional view of a portion of substrate support 102 in accordance with some embodiments of the present disclosure is shown without protrusions attached thereto. Substrate support 102 may include embodiments of support body 116 as described above and includes one or more receptacles 136. Each receptacle 136 has one or more sidewalls 206, a bottom 208, and an opening 212 in a first surface 218 that define a receptacle volume 214. The sidewalls 206 and bottom 208 of one or more receptacles 136 are generally the same material as substrate support 116 described in FIG. 1 above.

In some embodiments, and as shown in FIG. 2A, an annular seal band 222 (shown in phantom) may be disposed atop the first surface 218 of the support body 116. The seal band 222 may be made of the same material as support body 116 and may be integral with the support body or coupled thereto. The seal band 222 has an outer diameter, inner diameter, and height such that it can support a substrate (not shown) along a peripheral edge thereof during processing. The height of the seal band 222 above the first surface 218 may be selected to be the same as that of the plurality of protrusions such that the seal band and the protrusions together define a substantially planar support surface (e.g., the substantially planar support surface 103, 420). The seal band 222 facilitates forming a seal between a substrate (e.g., 120) and the support body 116 such that, in some embodiments, vacuum pressure can be maintained in the region between the backside of the substrate and the support body to chuck the substrate to the support body, or in some embodiments, a backside gas can be provided to the region between the backside of the substrate and the support body for example when the substrate support is an electrostatic chuck. Although only shown in FIG. 2A, a seal band as described herein can be used in combination with any of the other embodiments disclosed herein, specifically those shown in FIGS. 1, 2B-C, 3A-C, 4A-B, and 5.

Still referring to FIG. 2A, in some embodiments, the seal band 222, and optionally the first surface 218, may include a coating 219 disposed thereon. The coating 219 is of a material sufficient to reduce the coefficient of friction of the seal band 222 and optionally the first surface 218. Coating of the first surface 218 and/or seal band 222 may reduce the coefficient of friction thereof and reduce or eliminate damage to a substrate when disposed atop the substrate support. In some embodiments, the entire first surface 218 may be coated as described herein. In embodiments, coating 219 exhibits sufficient structural integrity for a high lifecycle under high temperature conditions, or high compressive force conditions. Non-limiting examples of suitable and effective coatings includes tribological coatings such as those exhibiting high strength and low friction, as well as being resistant to many process chemicals. In embodiments, a thin-film coating 219 may be applied including carbon or a nitride compound of carbon, and may include diamond-like carbon, and/or a combination thereof. One specific tribological coating that is particularly suitable for this application are diamond like coatings (DLC), such as the STAR® DLC and BALINIT® DLC provided by Balzers Oerlikon or the aDLC provided by Ionbond. Other tribological coatings that exhibit these characteristics, however, can be applied. In embodiments, a tetrahedral amorphous carbon (ta-C) may be applied. In embodiments, the coating is applied to a thickness of about 0.05 µm to about 5 µm. For example, a coating of only 2 µm thickness may be applied to the seal band 222 and/or the first surface 218.

Figure 2B:
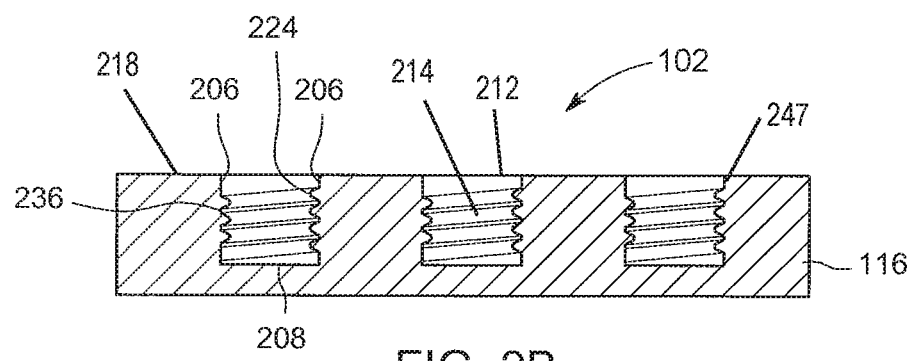

Referring now to FIG. 2B a schematic illustration of a cross-sectional view of substrate support 102 in accordance with some embodiments of the present disclosure is shown without protrusions attached thereto. Substrate support 102 may include threads 224 disposed in sidewall(s) 206 and extending to bottom 208 within receptacle 236 to make threaded holes. Threads 224 may be added to the receptacle by any means known in the art such as machining. Threads 224 may be made of the same material as support body 116 such as ceramics, alumina, or metallic composition such as stainless steel, duplex stainless steel, titanium, alloy steels, tool steel compositions, or combinations thereof. Threads 224 may be sized and spaced to connect with a mating or corresponding thread from a protrusion as described further below.

Figure 2C:
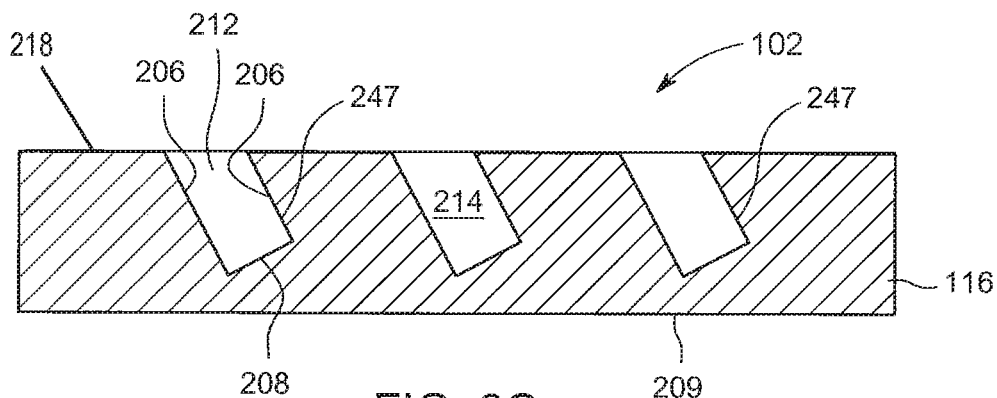

Referring now to FIG. 2C a schematic illustration of a cross-sectional view of substrate support 102 in accordance with some embodiments of the present disclosure is shown without protrusions attached thereto. Substrate support 102 shows receptacles 247 disposed within support body 116. In embodiments, the receptacle 247 has sidewalls 206, a bottom 208, and an opening 212 that define a receptacle volume 214. The sidewalls 206 and bottom 208 of one or more receptacles are formed at an angle with respect to the bottom 209 of the substrate support 116. In such embodiments, a portion of support body 116 is able to exert a force on the one or more protrusions disposed therein (not shown) when removing a substrate from atop the protrusions without removing the protrusion from the receptacle 247.

The inventors have observed that substrate damage can be prevented or substantially minimized by using substrate supporting elements fabricated from a material having a hardness less than or equal to that of a substrate to be supported. Non-limiting examples of suitable substrate supporting materials include, for example, thermostable plastic, or thermoplastic material, such as VESPEL® brand polyimide-based plastic, polyether ether ketone (PEEK), and PBI (polybenzimidazole) Celazole® brand thermoplastic. Other process-compatible materials exhibiting the above-noted soft properties may be used. In some embodiments, the elements that contact the substrate (e.g., protrusions 138, 309) may be entirely formed of the material. In some embodiments, the elements that contact the substrate may be formed of the material in at least portions of the element that contact the substrate.

Figure 3A:
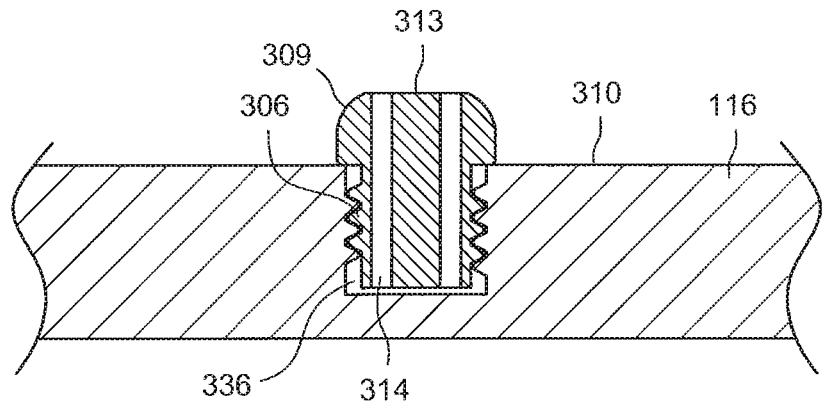
FIG. 3A schematically illustrates a cross-sectional side view of an exemplary shape of a protrusion for use in a substrate support in accordance with some embodiments of the present disclosure.
Figure 3B:
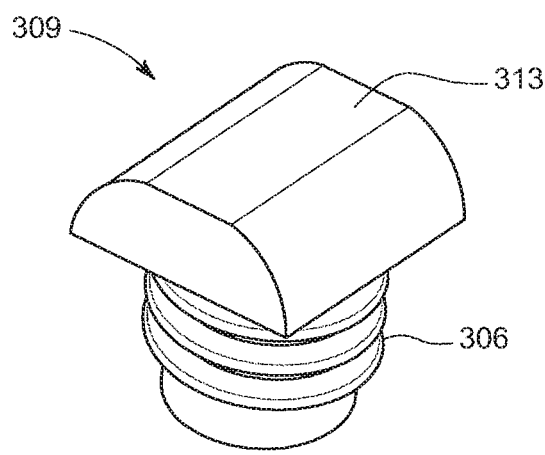
FIGS. 3B-3C schematically illustrate isometric views of a protrusion for use in a substrate support in accordance with some embodiments of the present disclosure.
Figure 3C:
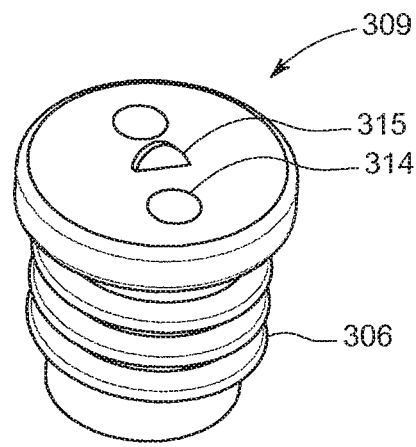

Referring now to FIGS. 3A-3C, schematic illustrations of exemplary shapes of a protrusion in accordance with some embodiments of the present disclosure are shown. All of the protrusions 309 are formed with the same height and have planarized top surfaces to contact the backside of the substrate (not shown), and the sum of the top surface areas of the protrusions 309 is significantly smaller than the support surface 310, thereby reducing the contact area between the support surface 310 and the substrate (not shown). With the smaller contact area between the support surface 310 and the substrate (not shown), embodiments merely bring the protrusions 309 to planarity instead of planarizing the whole support surface 310. Further, the smaller contact area can reduce the possibility of damage caused by the support surface 313 to the backside of the substrate. Referring to FIG. 3C, a nub 315 may be added to the top surface of the protrusion to further reduce the contact area. In some embodiments, the height of the protrusions 309 above the first surface may be from about 25 microns to about 200 microns, for example, about 50 microns, and the width or diameter of the protrusions 312 may be from about 500 microns to about 5000 microns.

For preventing the denting and scratching of the substrate (not shown), the shape of the protrusion 309 can be such as a hemispherical-like protrusion with a planarized support surface 313 shown in FIG. 3A. In some embodiments, protrusion 309 can be formed on a rounded rectangular foundation as shown in FIG. 3B or on a circular foundation as shown in FIG. 3C. The shapes, size and pattern of the protrusions described above are merely stated as examples, and the present disclosure is not limited thereto. The one or more protrusions 309 may include cylindrical mounds, posts, pyramids, cones, rectangular blocks, protrusions of varying sizes, any other shape that ensure the planarity of the substrate during processing. In embodiments, protrusions 309 include a threaded shaft 306 in order to be detachable from the support body 116. Referring to FIGS. 3A and 3C, one or more vent holes 314 may be included to vent air from receptacle 336 during processing.

Figure 4A:
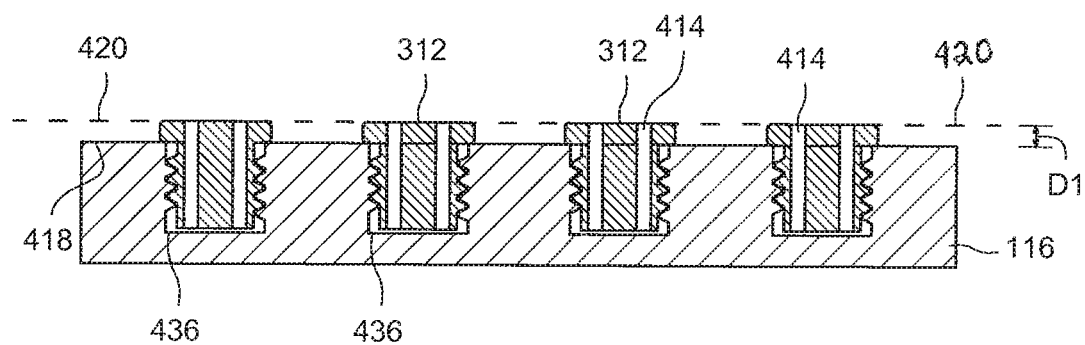
FIGS. 4A-4B schematically illustrates a cross-sectional view of a substrate support with protrusions in accordance with some embodiments of the present disclosure.
Figure 4B:
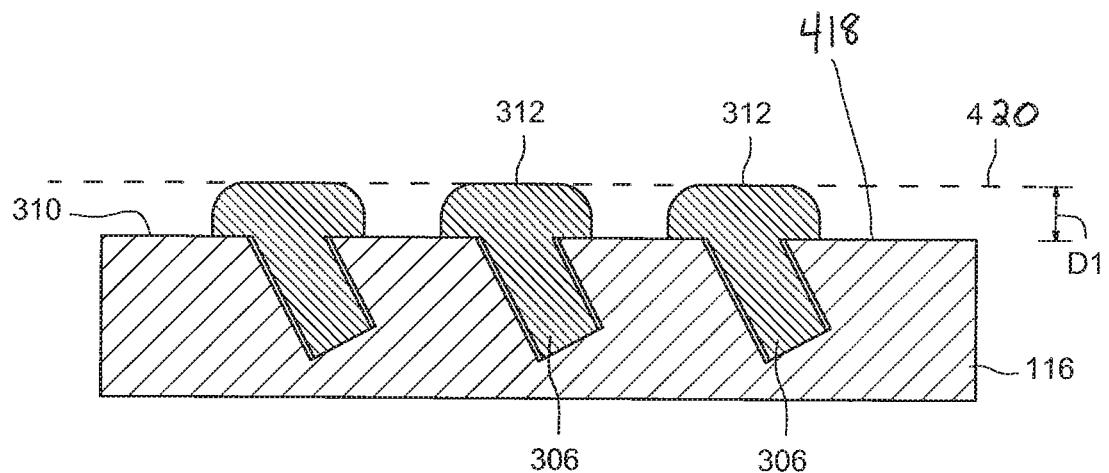

FIGS. 4A-4B schematically illustrates a cross-sectional view of a substrate support with protrusions in accordance with some embodiments of the present disclosure. Referring to FIG. 4A, in one embodiment, the plurality of protrusions 312 and the support body 116 are detachable, and respectively disposed within corresponding ones of the one or more receptacles 436 and projecting from the first surface 418. The one or more protrusions 312 at least partially define a substantially planar support surface 420 above the first surface 418. In one embodiment, the height, D1, of the protrusions 309 may be from about 10 microns to about 50 microns, for example, about 25 microns, and the width or diameter of the protrusions 312 may be from about 500 microns to about 5000 microns. One or more vent holes 414 may be included to vent air from receptacle 336 during processing.

In some embodiments, as shown in FIG. 4B, the plurality of protrusions 312 are formed separately and detach from or are removably coupled to the support body 116. In embodiments, protrusions 309 include a smooth, non-threaded shaft 306 in order to be detachable from the support body 116. The one or more protrusions 312 at least partially define a substantially planar support surface 420 above the first surface 418.

Figure 5:
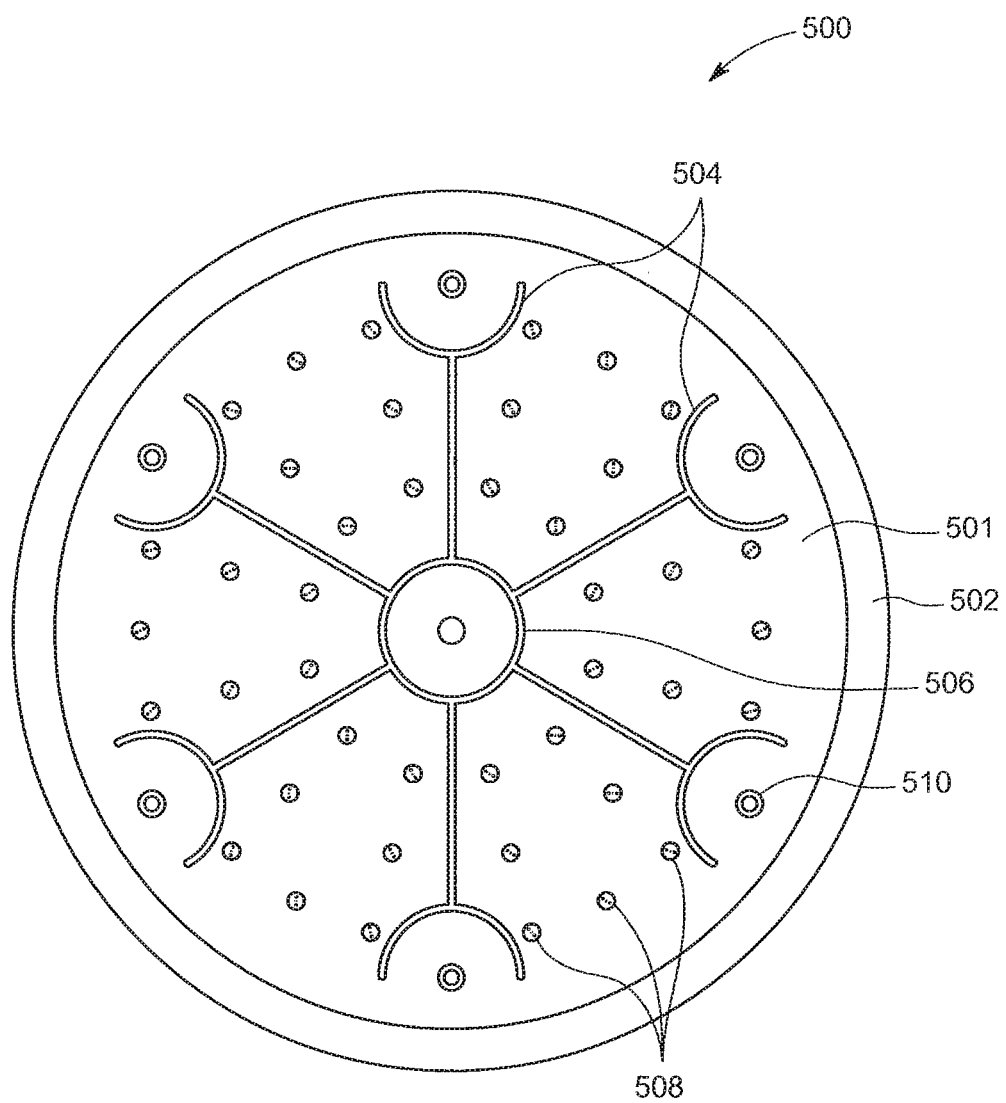
FIG. 5 schematically illustrates a top view of a vacuum chuck assembly in accordance with some embodiments of the present disclosure.

FIG. 5 schematically illustrates a top view of a vacuum chuck assembly in accordance with embodiments of the present disclosure. The support body 500 has a support surface 501 for supporting substrate (not shown) thereon. A plurality of protrusions 508 are formed on the support surface 501 upon which the substrate may rest during processing. In one embodiment, the support surface 501 is 300 mm in diameter and has between 100 and 500 protrusions, for example, between 150 and 200 protrusions that occupy approximately 10% of the back side surface area of the substrate placed thereon. In one embodiment the protrusions 508 are arranged in a substantially linear arrangement across the support surface 501. In another embodiment, the protrusions 508 are arranged in a radial pattern emanating from the center of the support surface. In one embodiment, the support surface 501 is 200 mm in diameter. Although shown as circular, it should be understood that the support surface 501 may include other shapes such as squares or rectangles.

Still referring to FIG. 5, a seal band 502 is disposed around a peripheral edge of the support surface 501. During processing, the seal band 502 forms a low pressure region between the support surface 501 and the planar support surface (not shown) above the support surface 501. In embodiments, seal band 502 is coated with a material suitable for reducing the friction coefficient thereof as described above. Support surface 501 may further include: one or more contact points 510 between the surface 501 and the substrate (not shown). In embodiments, the one or more contact points 510 are not coated as described above and are softer than the support surface 501 and/or the substrate.

Still referring to FIG. 5, the support surface 501 includes a plurality of grooves 504. The plurality of grooves 504 are formed in a pattern for exerting suction force, for example uniform suction force, when a substrate is disposed upon the planar support surface during processing under vacuum.

While the foregoing is directed to embodiments of the present disclosure, other and further embodiments of the disclosure may be devised without departing from the basic scope thereof.

The invention claimed is:

1. A substrate support, comprising:
   a support body having a first surface;
   one or more receptacles extending through the first surface and into the support body at an angle of less than 90 degrees with respect to the first surface; and
   one or more thermoplastic protrusions respectively disposed within corresponding ones of the one or more receptacles and projecting from the first surface, wherein the one or more thermoplastic protrusions have a planarized top surface for contacting and supporting a substrate that at least partially define a substantially planar support surface above the first surface, wherein the one or more thermoplastic protrusions have an angled lower portion received by the one or more receptacles which are configured to resist removal of the one or more thermoplastic protrusions in a perpendicular direction to the first surface, and wherein one or more thermoplastic protrusions are replaceable or detachable from the support body.

2. The substrate support of claim 1, further comprising a seal band disposed around a peripheral edge of the support body.

3. The substrate support of claim 2, wherein the seal band is coated with a material that reduces a friction coefficient thereof.

4. The substrate support of claim 1, wherein each of the one or more thermoplastic protrusions include thermoplastic contact points to support the substrate, wherein the thermoplastic contact points are softer than the first surface.

5. The substrate support of claim 1, wherein the one or more thermoplastic protrusions comprise polyimide thermoplastic, polyether ether ketone thermoplastic, or polybenzimidazole thermoplastic.

6. A process chamber, comprising:
   a chamber body having sidewalls and a bottom; and
   a substrate support disposed within the chamber body, the substrate support comprising:
      a support body having a first surface, wherein the first surface comprises quartz, ceramic, metal or combinations thereof;
      one or more receptacles extending through the first surface and into the support body; and
      one or more threaded thermoplastic protrusions respectively disposed within corresponding ones of the one or more receptacles and projecting from the first surface, wherein the one or more threaded thermoplastic protrusions comprise at least two vent holes, in a planarized top surface of the one or more threaded thermoplastic protrusions, and a nub protruding above the planarized top surface with an uppermost point that at least partially defines a substantially planar support surface above the first surface.

7. The process chamber of claim 6, wherein one or more threaded thermoplastic protrusions are detachable from the support body such that they can be coupled to the support body and uncoupled from the support body.

8. The process chamber of claim 6, wherein the one or more threaded thermoplastic protrusions are softer than the first surface.

9. The process chamber of claim 6, wherein the substrate support comprises a sealing band coated with a material that reduces a friction coefficient thereof, and wherein the sealing band is disposed around a peripheral edge of the support body for forming a low pressure region between the substantially planar support surface and the first surface when a substrate is disposed upon the substantially planar support surface.

10. A substrate support, comprising:
    a support body having a first surface;
    one or more receptacles extending through the first surface and into the support body; and
    one or more thermoplastic protrusions respectively disposed within corresponding ones of the one or more receptacles and projecting from the first surface, wherein the one or more thermoplastic protrusions at least partially define a substantially planar support surface above the first surface, wherein the one or more thermoplastic protrusions have a planarized top surface for supporting a substrate, and wherein the one or more thermoplastic protrusions comprise a nub disposed on the planarized top surface and two or more vent holes configured to vent air from the one or more receptacles during processing.

11. The substrate support of claim 10, wherein one or more thermoplastic protrusions are replaceable or detachable from the support body.

12. The substrate support of claim 10, wherein the one or more thermoplastic protrusions are softer than the first surface.

13. The substrate support of claim 10, wherein the one or more thermoplastic protrusions are made of a thermoplastic material comprising polyimide thermoplastic, polyether ether ketone thermoplastic, or polybenzimidazole thermoplastic.

14. The substrate support of claim 10, wherein the one or more thermoplastic protrusions have a height of about 25 microns to about 200 microns.

15. The substrate support of claim 10, wherein the one or more receptacles are threaded holes.

16. The substrate support of claim 15, wherein the one or more thermoplastic protrusions include threads to mate with the threaded holes.

17. The substrate support of claim 10, wherein the one or more thermoplastic protrusions are a plurality of protrusions arranged about the support body.

18. The substrate support of claim 10, wherein the one or more thermoplastic protrusions comprise polybenzimidazole thermoplastic, and wherein the first surface comprises stainless steel.

19. The substrate support of claim 10, wherein the one or more thermoplastic protrusions comprise polybenzimidazole thermoplastic, and wherein the first surface comprises quartz, ceramic, or metal.

* * * * *